United States Patent
Turner et al.

(10) Patent No.: US 7,333,904 B2
(45) Date of Patent: Feb. 19, 2008

(54) METHOD OF DETERMINING FET JUNCTION TEMPERATURE

(75) Inventors: Steven R. Turner, Carmel, IN (US); Mohammad Zakaria, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 158 days.

(21) Appl. No.: 11/212,254

(22) Filed: Aug. 26, 2005

(65) Prior Publication Data
US 2007/0061099 A1  Mar. 15, 2007

(51) Int. Cl.
G01R 25/00 (2006.01)
(52) U.S. Cl. ...................................... 702/65
(58) Field of Classification Search ............... 702/65
See application file for complete search history.

(56) References Cited

U.S. PATENT DOCUMENTS 5,600,575 A * 2/1997 Anticole .................... 702/132

2005/0192773 A1 * 9/2005 Sheng et al. ............... 702/132

OTHER PUBLICATIONS

Wilson, Jim, "Thermal Issues in GaAs Analog RF Devices," Feb. 2002, http://electronics-cooling.com/articles/2002/2002_february_a1.php (viewed on Mar. 21, 2007).*
Filicori, Fabio; Rinaldi, Paola; Vannini, Giorgio; Santarelli, Alberto; "A New Technique for Thermal Resistance Measurement in Power Electron Devices," Oct. 5, 2005, IEEE Transactions on Instrumentation and Measurement, vol. 54, No. 5, pp. 1921-1925.*

* cited by examiner

Primary Examiner—John Barlow
Assistant Examiner—Lisa Sievers
(74) Attorney, Agent, or Firm—Scott A. McBain

(57) ABSTRACT

A processor is responsive to a thermistor temperature ($T_{th}$) adjacent a FET and to a drain-to-source voltage ($V_{DS}$) of the FET. The processor stores the characteristics of the PET and a thermal model of the system hardware and uses a first set of equations to determine the temperature ($T_J$) at the junction of the PET in a stable region of operation where $T_J - T_{th}$ is nearly constant. The processor is further responsive to a step change in successive measurements of $V_{DS}$ indicative of a lag of $T_{th}$ relative to $T_J$. In this step-change region, the processor then resolves $T_J$ based upon a second set of equations.

9 Claims, 3 Drawing Sheets

METHOD OF DETERMINING FET JUNCTION TEMPERATURE

BACKGROUND OF THE INVENTION

1. Field of the Invention

A method and system for determining the electrical resistance of a field-effect transistor (FET).

2. Description of the Prior Art

A field-effect transistor (FET) is often used as a switch in power electronics to control current to larger electrical load, such as an electrical motor. As electrical current (I) flows through the FET, a drain-to-source voltage ($V_{DS}$) is created by virtue of the FET on resistance ($R_{DS}$). It is useful to know the current and power (P) so that the current provided to the load can be directly and accurately controlled and to prevent exceeding the operating temperature of the FET.

The drain-to-source voltage ($V_{DS}$) of an FET can be measured directly with well known electrical devices. It is difficult to determine the real time current and power of an FET because the resistance ($R_{DS}$) of the FET can vary significantly with temperature. In some instances, the resistance ($R_{DS}$) of the FET can be twice as high at 175° C. as at 25° C. If the temperature at the junction ($T_J$) is known, the resistance ($R_{DS}$) of the FET can be determined by referring to the characteristics of the FET as provided in the data sheets of the manufacturer. However, it is difficult to measure the temperature at the junction ($T_J$) of the FET directly, albeit it is possible to use a thermistor placed close to the FET to measure the temperature (Tth).

SUMMARY OF THE INVENTION AND ADVANTAGES

In accordance with the subject invention the real time current and power of a field effect transistor (FET) is ascertained by determining the temperature $T_J$ at the junction of the FET in a stable region of operation where the junction temperature minus the measured temperature ($T_J$–$T_{th}$) is nearly constant accordance with a first set of equations until a step change occurs in successive measurements of the measured drain-to-source voltage $V_{DS}$ indicative of a lag of $T_{th}$ relative to $T_J$ thereby rendering $T_{th}$ unusable in the first set of equations. In response to the step change, an initial FET current $I_{FET}$ is immediately determined using the most recent value of $R_{DS}$. The junction temperature $T_J$ of the FET is resolved based upon a second set of equations until $T_J$–$T_{th}$ re-stabilizes.

Accordingly, this invention provides a method or algorithm to provide a nominal value for the temperature at the junction ($T_J$) of the FET in real time operation of the FET in power electronics circuitry.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
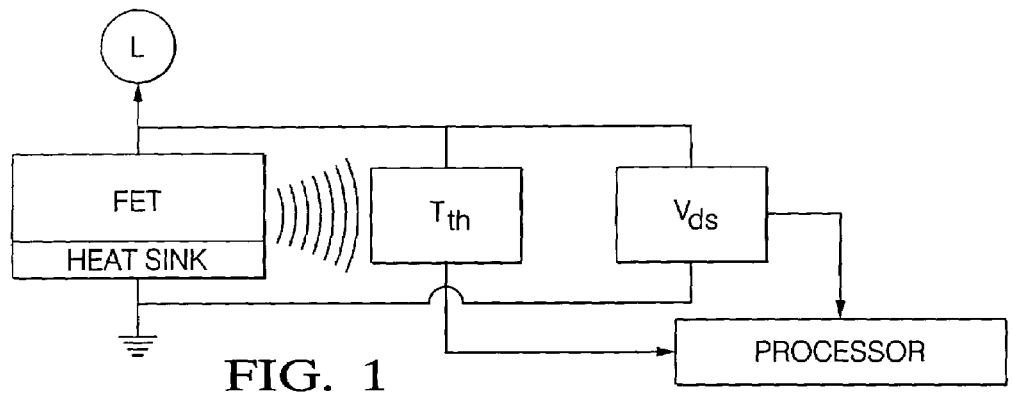
FIG. 1 is a schematic view of the components employed in the subject invention.
Figure 2:
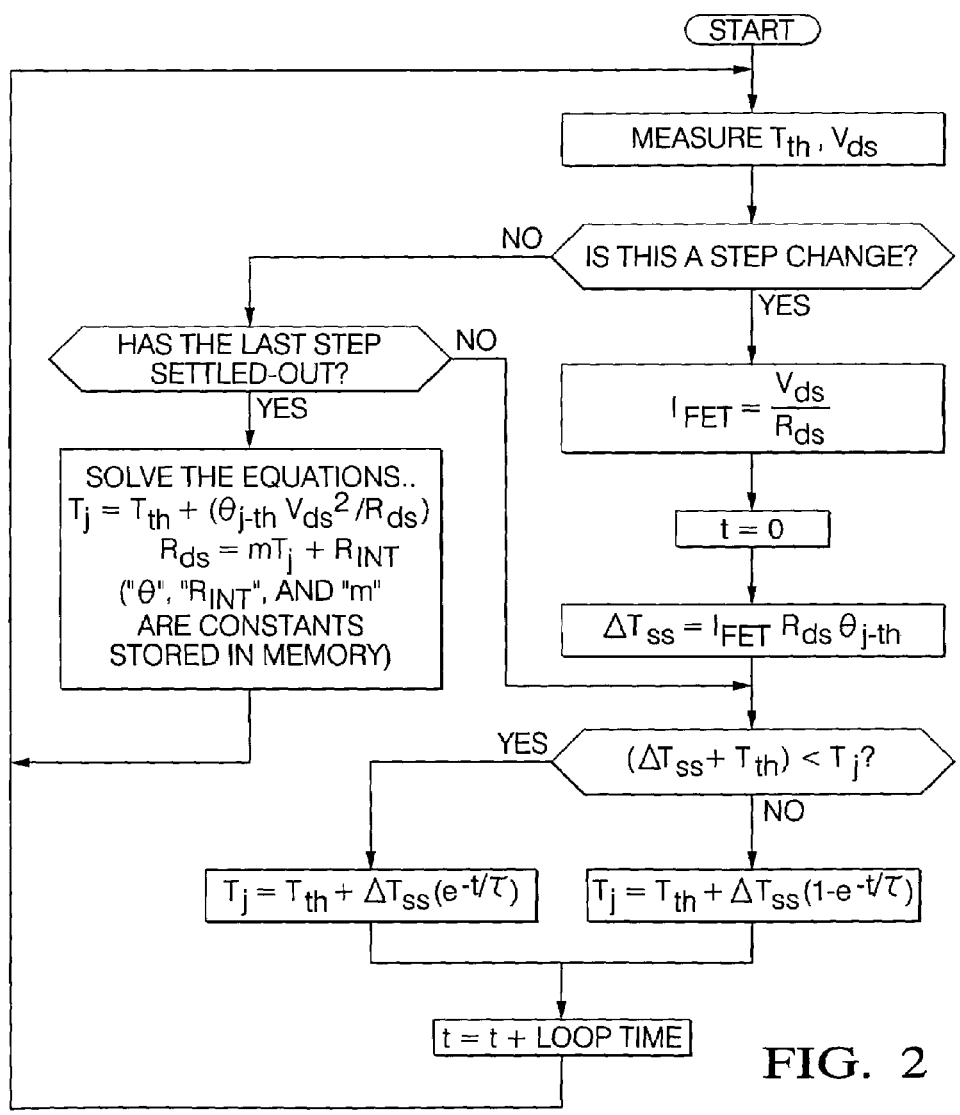
FIG. 2 is a schematic of the steps in accordance with the subject invention.

Referring to the FIG. 1, a system for determining the current through a field effect transistor (FET) is illustrated. In a power control system, the field-effect transistor (FET) functions as a switch to control power to a load (L). A thermsistor is mounted in close thermal proximity to the FET for measuring or inferring the temperature $T_{th}$ adjacent the junction of the FET. The mechanical packaging of the FET would include a heat sink for dissipating heat generated by the FET. Also included is a voltage meter ($V_{DS}$) and appropriate circuitry for measuring the drain-to-source voltage ($V_{DS}$) of the FET.

The system is distinguished by a processor or digital core responsive to $T_{th}$ and $V_{DS}$ and for storing characteristics of the FET and a thermal model of the system hardware for determining the temperature $T_J$ at the junction of the FET in a stable region of operation where $T_J$–$T_{th}$ is nearly constant accordance with a first set of equations. The processor is further responsive to a step change in successive measurements of $V_{DS}$ indicative of a lag of $T_{th}$ relative to $T_J$ thereby rendering $T_{th}$ unusable in the first set of equations for immediately determining an initial FET current $I_{FET}$ in response to the step change using the most recent value of $R_{DS}$ in accordance with $I_{FET}=V_{DS}/R_{DS}$ and resolving $T_J$ based upon a second set of equations and reverting to the first set of equations in response to re-stabilization of $T_J$–$T_{th}$.

Figure 3:
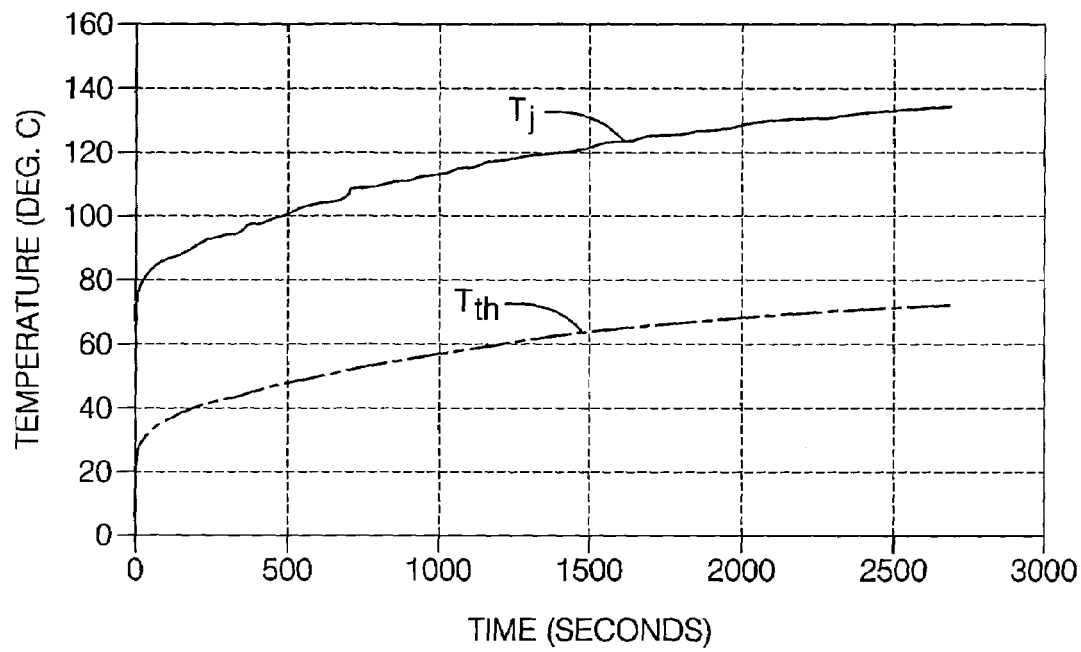
FIG. 3 is a graph of the stable region of operation where the junction temperature minus the measured temperature ($T_J$–$T_{th}$) is nearly constant.

In the stable region of operation, the changes in FET current (I) flow are relatively gradual and changes in thermistor ($T_{th}$) temperature accurately reflect changes in the junction temperature. For a given FET current ($I_{FET}$), $T_J$–$T_{th}$ is nearly constant, as illustrated in FIG. 3, and the following equations are applicable:

$$T_J = T_{th} + (\theta_{J-th} \, V_{DS}^2/R_{DS}) \text{ and}$$

$$R_{DS} = m \, T_J + R_{INT}$$

where $\theta$ is a fixed value of the thermal resistance determined from a thermal model of the system and m is the slope ($\Delta R_{DS}/\Delta T_J$) and $R_{INT}$(intercept) are characteristics of the FET, the characteristics of the FET are provided in the manufacturer's data sheets. The thermal resistance $\theta$ is determined through FEA (Finite Element Analysis) and/or experimental data. The thermistor temperature $T_{th}$ and the FET voltage $V_{DS}$ are measured in real time. Simultaneous equations remain with unknowns $R_{DS}$ and $T_J$. Solving these equations produces two roots for $T_J$, but one can be ignored because it is unreasonable based upon the trend of the data to that point. Therefore, in the stable region of operation, the FET junction temperature $T_J$ can be determined from real time measurements of thermistor temperature $T_{th}$ and the FET voltage $V_{DS}$.

A step change in successive measurements of FET voltage $V_{DS}$ indicates a step change in FET current $I_{FET}$. Although the thermistor is placed in close proximity to the FET, some thermal capacitance results in a time constant τ (tau) between the thermistor and the FET junction. The value of the time constant τ is a function of the thermal interface between the FET junction and the thermistor $T_{th}$, e.g., the distance and the material of the separation. When the step change in FET current $I_{FET}$ occurs, the thermistor temperature $T_{th}$ will lag the FET junction temperature $T_J$ due to this thermal capacitance, thereby rendering thermistor temperature $T_{th}$ unstable for some time period immediately following a current step change. Accordingly, the method of determining the electrical resistance ($R_{DS}$) and/or current $I_{FET}$ of a field effect transistor (FET) is accomplished by determining a step change in successive measurements of $V_{DS}$ indicative of a lag of $T_{th}$ relative to $T_J$ thereby rendering $T_{th}$ unusable in the first set of equations and immediately determining an initial FET current $I_{FET}$ in response to the step change using the most recent value of $R_{DS}$ in accordance with $I_{FET}=V_{DS}/R_{DS}$. The method is distinguished by resolving $T_J$ based upon a second set of equations until $T_J-T_{th}$ re-stabilizes.

Resolving $T_J$ is further defined as resolving $T_J$ as equaling $T_{th}+\Delta T_{SS}(1-e^{-t/\tau})$ when $\Delta T_{SS}+T_{th} \geq T_J$ and resolving $T_J=T_{th}+\Delta T_{SS}(e^{-t/\tau})$ when $\Delta T_{SS}+T_{th} \geq T_J$ where $\tau$ is a constant and $\Delta T_{SS}$ is the steady-state temperature difference between the $T_J$ and $T_{th}$ at the initial FET current $I_{FET}$ determined in accordance with $\Delta T_{SS}=I_{FET}^2 R_{DS} \theta_{J-th}$.

The invention includes a system for determining the current through a field effect transistor (FET) functioning as a switch and mounted on a heat sink. A processor is responsive to $T_{th}$ and $V_{DS}$ and stores characteristics of the FET and a thermal model of the system for determining the temperature $T_J$ at the junction of the FET in a stable region of operation where $T_J-T_{th}$ is nearly constant accordance with the equations $T_J=T_{th}+(\theta_{J-th} V_{DS}^2/R_{DS})$ and $R_{DS}=m T_J+R_{INT}$ where $\theta$ is a fixed value of the thermal resistance determined from the thermal model of the system and m is the slope and $R_{INT}$ (intercept) are the characteristics of the FET. The processor determines a step change in successive measurements of $V_{DS}$ indicative of a lag of $T_{th}$ relative to $T_J$ thereby rendering $T_{th}$ unusable in the foregoing equations and immediately determines an initial FET current $I_{FET}$ in response to the step change using the most recent value of $R_{DS}$ in accordance with $I_{FET}=V_{DS}/R_{DS}$. The processor resolves $T_J=T_{th}+\Delta T_{SS}(1-e^{-t/\tau})$ when $\Delta T_{SS}+T_{th} \geq T_J$ and resolves $T_J=T_{th}+\Delta T_{SS}(e^{-t/\tau})$ when $\Delta T_{SS}+T_{th} \leq T_J$ where $\tau$ is a constant and $\Delta T_{SS}$ is the steady-state temperature difference between the $T_J$ and $T_{th}$ at the initial FET current $I_{FET}$ determined in accordance with $\Delta T_{SS}=I_{FET}^2 R_{DS} \theta_{J-th}$.

Figure 4:
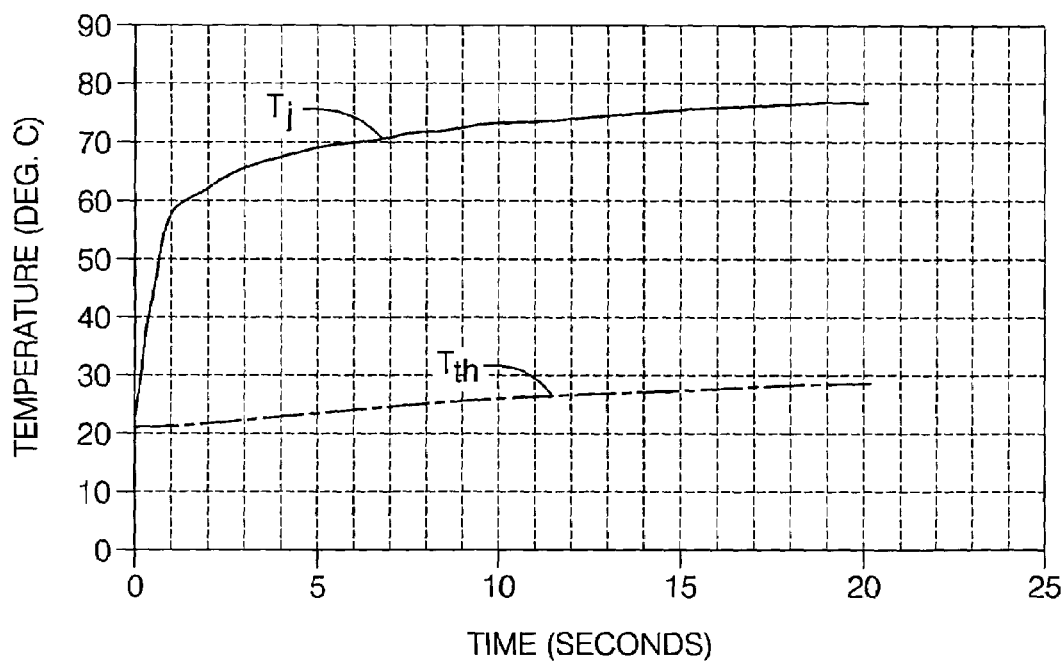
FIG. 4 is a graph showing the very short period of operation in the unstable region where the junction temperature minus the measured temperature ($T_J$–$T_{th}$) is not constant.

The total algorithm operates as the software continuously polls Vds for the occurrence of a step change. When a step change occurs, the second set of equations for the unstable region are applied, until the step "settles out" or re-stabilizes. At that point, the first set of equations for the stable region are applied, until a new step occurs. For the example hardware, inspection of the data indicates that $\tau$ for the unstable region is approximately one second as shown in FIG. 4.

The duration of the step-change region would depend upon the slope and magnitude of successive Vds measurements, but it should never exceed three times $\tau$, and would usually be much less. This is because the time to reach the stable region will be significantly longer for a high-current step than when current drops to a very low (or zero) level. Although the time constant ($\tau$) is the same in either case, the hardware would typically be operated such that the heat sink always stays relatively cool. Analysis of this fact shows that would approach (within some tolerance) the expected stable region much sooner when FET currents drop low, than it would when high-current steps occur.

In an example system, Vds step=0.328V and $$I_{FET} = \frac{.328}{.004} = 82A.$$

Then, $$\Delta T_{SS} = I_{FET}^2 R_{DS} \theta_{J-th} = (82)^2(.004)(2.0) = 54° C.$$

Figure 5:
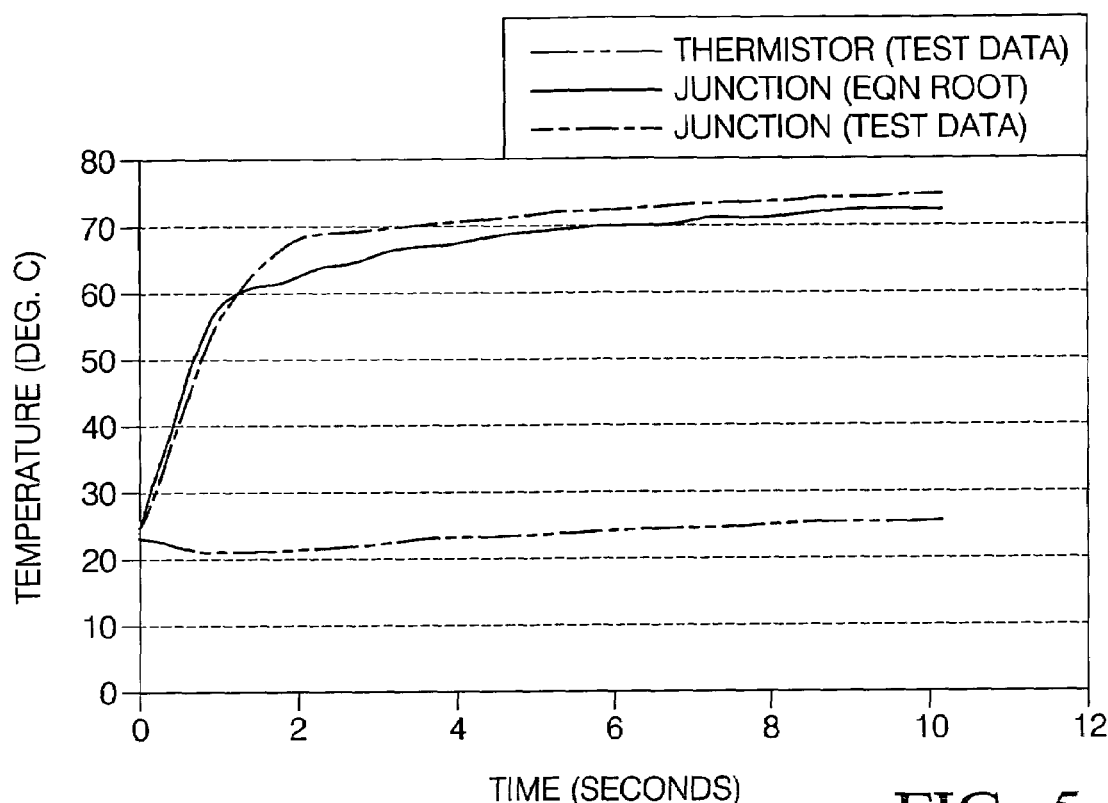
FIGS. 5 and 6 are graphs comparing experimental data with data obtained using the steps of the subject invention.
Figure 6:
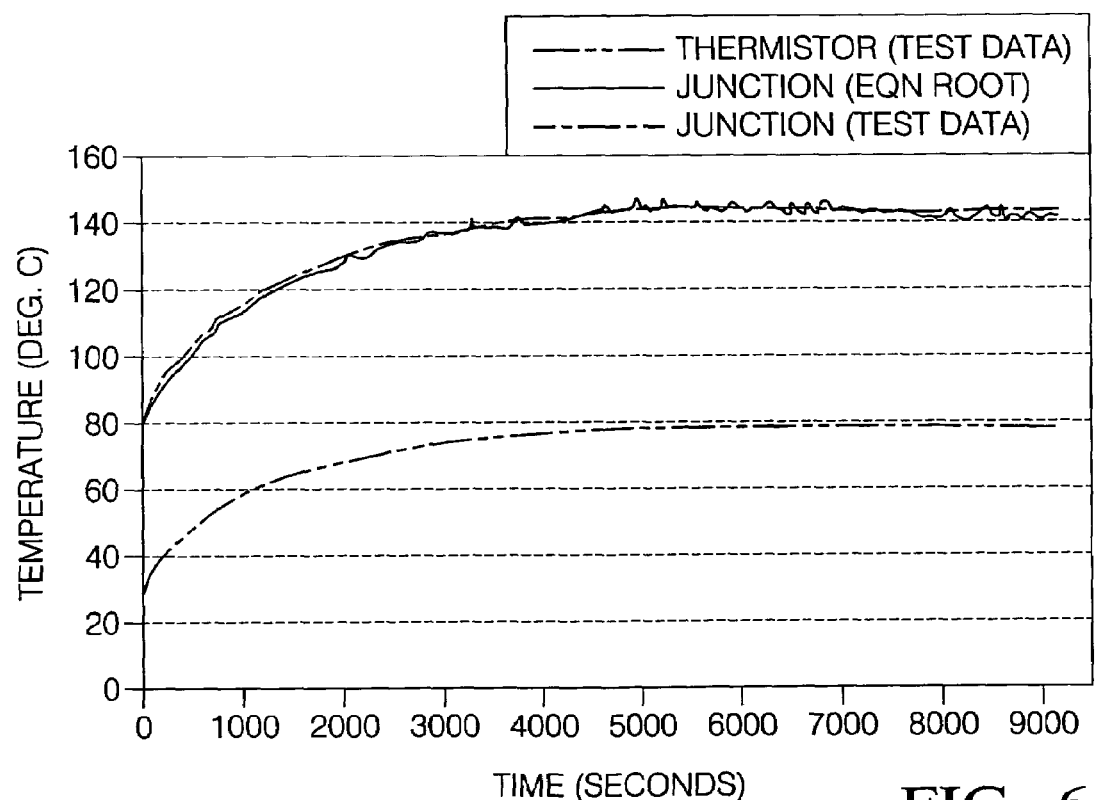

Therefore, $T_J=T_{th}+\Delta T_{SS}(1-e^{-t/\tau})$, where $\tau=1.0$ sec. and $T_{th}=23°$ C. Beyond two (2.0) sec, junction temperature $T_J$ would be determined by the first set of equations for the stable region, until another step change in current occurs. FIGS. 5 and 6 compare the experimental data with the results of the applied algorithm for a step of seventy (70) amps. The "experimental" $T_J$ values were determined based on the fact that the current was known to be seventy (70) amps. In an actual application, the current would, of course, be unknown. As can be seen, the algorithm output is nearly identical for about one $\tau$, then rises to a maximum of 7° C. above the actual $T_J$ at about two $\tau$, and then tracks $T_J$ closely beyond three $\tau$.

The magnitude of the Vds change that defines a "step" depends upon the temperature resolution and response time required for the application. Conservative selection of the step change definition would serve well to protect the FET against the possibility of severe transient occurrences (e.g., short-circuits). On the other hand, higher accuracy under most operating conditions is possible with this technique if the extreme transient occurrence is less of a concern.

Obviously, many modifications and variations of the present invention are possible in light of the above teachings. The invention may be practiced otherwise than as specifically described within the scope of the appended claims, wherein that which is prior art is antecedent to the novelty set forth in the "characterized by" clause. The novelty is meant to be particularly and distinctly recited in the "characterized by" clause whereas the antecedent recitations merely set forth the old and well-known combination in which the invention resides. These antecedent recitations should be interpreted to cover any combination in which the incentive novelty exercises its utility.

What is claimed is:

1. A method of determining a junction temperature ($T_J$) of a field effect transistor (FET) comprising the steps of;
    measuring the temperature ($T_{th}$) adjacent to the FET,
    measuring the drain-to-source voltage ($V_{DS}$) of the FET,
    determining the temperature $T_J$ at the junction of the FET in a stable region of operation where $T_J-T_{th}$ is nearly constant accordance with a first set of equations,
    determining a step change in successive measurements of $V_{DS}$ indicative of a lag of $T_{th}$ relative to $T_J$ thereby rendering $T_{th}$ unusable in the first set of equations,
    immediately determining an initial FET current $I_{FET}$ in response to the step change using the most recent value of $R_{DS}$ in accordance with $I_{FET}=V_{DS}/R_{DS}$, and
    determining the temperature $T_J$ by resolving $T_J$ based upon a second set of equations until $T_J-T_{th}$ re-stabilizes.

2. A method as set forth in claim 1 wherein resolving $T_J$ is further defined as resolving $T_J$ as equaling $T_{th}+\Delta T_{SS}(1-e^{-t/\tau})$ when $\Delta T_{SS}+T_{th} \geq T_J$ and resolving $T_J=T_{th}+\Delta T_{SS}(e^{-t/\tau})$ when $\Delta T_{SS}+T_{th} \leq T_J$ where $\tau$ is a constant and $\Delta T_{SS}$ is the steady-state temperature difference between the $T_J$ and $T_{th}$ at the initial FET current $I_{FET}$ determined in accordance with $\Delta T_{SS}=I_{FET}^2 R_{DS}\, \theta_{J\text{-}th}$ where $\theta_{J\text{-}th}$ is a fixed value of the thermal resistance determined from a thermal model of the system.

3. A method as set forth in claim 2 wherein determining the temperature $T_J$ with a first set of equations is further defined as $T_J=T_{th}+(\theta_{J\text{-}th}\, V_{DS}^2/R_{DS})$ and $R_{DS}=m\, T_J+R_{INT}$ where m is the slope and $R_{INT}$ (intercept) are characteristics of the FET.

4. A method of determining the current through a field effect transistor (FET) functioning as a switch comprising the steps of;
measuring the temperature $T_{th}$ adjacent the junction of an FET,
measuring the drain-to-source voltage ($V_{DS}$) of the FET,
determining the temperature $T_J$ at the junction of the FET in a stable region of operation where $T_J-T_{th}$ is nearly constant accordance with the first set of equations $T_J=T_{th}+(\theta_{J\text{-}th}\, V_{DS}^2/R_{DS})$ and $R_{DS}=m\, T_J+R_{INT}$ where $\theta$ is a fixed value of the thermal resistance determined from a thermal model of the system and m is the slope and $R_{INT}$ (intercept) are found in the FET data sheets from the manufacturer,
determining a step change in successive measurements of $V_{DS}$ indicative of a lag of $T_{th}$ relative to $T_J$ thereby rendering $T_{th}$ unusable in the foregoing equations,
immediately determining an initial FET current $I_{FET}$ in response to the step change using the most recent value of $R_{DS}$ in accordance with $I_{FET}=V_{DS}/R_{DS}$, and
determining the current through the FET by resolving $T_J=T_{th}+\Delta T_{SS}(1-e^{-t/\tau})$ when $\Delta T_{SS}+T_{th}\geq T_J$ and resolving $T_J=T_{th}+\Delta T_{SS}(e^{-t/\tau})$ when $\Delta T_{SS}+T_{th}\leq T_J$ where $\tau$ is a constant and $\Delta T_{SS}$ is the steady-state temperature difference between the $T_J$ and $T_{th}$ at the initial FET current $I_{FET}$ determined in accordance with $\Delta T_{SS}=I_{FET}^2 R_{DS}\, \theta_{J\text{-}th}$.

5. A system for determining the current through a field effect transistor (FET) comprising:
a thermistor for measuring the temperature $T_{th}$ adjacent the junction of the FET;
a voltage meter for measuring the drain-to-source voltage ($V_{DS}$) of the FET; and
a processor responsive to $T_{th}$ and $V_{DS}$ and for storing characteristics of the FET and a thermal model of said system for determining the temperature $T_J$ at the junction of the FET in a stable region of operation where $T_J-T_{th}$ is nearly constant accordance with a first set of equations and responsive to a step change in successive measurements of $V_{DS}$ indicative of a lag of $T_{th}$ relative to $T_J$ thereby rendering $T_{th}$ unusable in said first set of equations for immediately determining an initial FET current $I_{FET}$ in response to the step change using the most recent value of $R_{DS}$ in accordance with $I_{FET}=V_{DS}/R_{DS}$ and resolving $T_J$ based upon a second set of equations and reverting to said first set of equations in response to re-stabilization of $T_J-T_{th}$.

6. A system as set forth in claim 5 wherein resolving $T_J$ based upon a second set of equations comprising $T_J=T_{th}+\Delta T_{SS}(1-e^{-t/\tau})$ when $\Delta T_{SS}+T_{th}\geq T_J$ and resolving $T_J=T_{th}+\Delta T_{SS}(e^{-t/\tau})$ when $\Delta T_{SS}+T_{th}\leq T_J$ where $\tau$ is a constant and $\Delta T_{SS}$ is the steady-state temperature difference between the $T_J$ and $T_{th}$ at the initial FET current $I_{FET}$ determined in accordance with $\Delta T_{SS}=I_{FET}^2 R_{DS}\theta_{J\text{-}th}$.

7. A system as set forth in claim 6 wherein determining $T_J$ with a first set of equations comprising $T_J=T_{th}+(\theta_{J\text{-}th}\, V_{DS}^2/R_{DS})$ and $R_{DS}=m\, T_J+R_{INT}$ where $\theta$ is a fixed value of the thermal resistance determined from said thermal model of said system and m is the slope and $R_{INT}$ (intercept) are said characteristics of the FET.

8. A system for determining the current through a field effect transistor (FET) comprising:
a heat sink for the FET;
a thermistor for measuring the temperature $T_{th}$ adjacent the junction of the FET;
a voltage meter for measuring the drain-to-source voltage ($V_{DS}$) of the FET; and
a processor responsive to $T_{th}$ and $V_{DS}$ and for storing characteristics of the FET and a thermal model of said system for determining the temperature $T_J$ at the junction of the FET in a stable region of operation where $T_J-T_{th}$ is nearly constant accordance with the equations $T_J=T_{th}+(\theta_{J\text{-}th}\, V_{DS}^2/R_{DS})$ and $R_{DS}=m\, T_J+R_{INT}$ where $\theta$ is a fixed value of the thermal resistance determined from said thermal model of said system and m is the slope and $R_{INT}$ (intercept) are said characteristics of the FET, and
for determining a step change in successive measurements of $V_{DS}$ indicative of a lag of $T_{th}$ relative to $T_J$ thereby rendering $T_{th}$ unusable in the foregoing equations, and
for immediately determining an initial FET current $I_{FET}$ in response to the step change using the most recent value of $R_{DS}$ in accordance with $I_{FET}=V_{DS}/R_{DS}$, and
for resolving $T_J=T_{th}+\Delta T_{SS}(1-e^{-t/\tau})$ when $\Delta T_{SS}+T_{th}\geq T_J$ and resolving $T_J=T_{th}+\Delta T_{SS}(e^{-t/\tau})$ when $\Delta T_{SS}+T_{th}\leq T_J$ where $\tau$ is a constant and $\Delta T_{SS}$ is the steady-state temperature difference between the $T_J$ and $T_{th}$ at the initial FET current $I_{FET}$ determined in accordance with $\Delta T_{SS}=I_{FET}^2 R_{DS}\, \theta_{J\text{-}th}$.

9. A method of determining a junction temperature ($J_T$) of a field effect transistor (FET) comprising the steps of:
measuring the temperature ($T_{th}$) adjacent to the FET,
measuring the drain-to-source voltage ($V_{DS}$) of the FET,
analyzing successive measurements of $V_{DS}$ to determine whether the FET is operating in a stable region or a step-change region identified by a step change of $V_{DS}$,
determining the temperature $T_J$ when the FET is operating in the stable region in accordance with a first set of equations,
determining the temperature $T_J$ when the FET is operating in the step-change region in accordance with a second set of equations.

* * * * *